(12) United States Patent  (10) Patent No.: US 8,441,181 B2
Kim  (45) Date of Patent: May 14, 2013

(54) ORGANIC LIGHT EMITTING DISPLAY AND MANUFACTURING METHOD THEREOF

(75) Inventor: Eun-Ah Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 61 days.

(21) Appl. No.: 12/945,373

(22) Filed: Nov. 12, 2010

(65) Prior Publication Data

US 2011/0193475 A1  Aug. 11, 2011

(30) Foreign Application Priority Data

Feb. 8, 2010  (KR) .................. 10-2010-0011511

(51) Int. Cl.
*H01L 51/50*  (2006.01)

(52) U.S. Cl.
USPC ................... 313/504; 313/506; 313/509

(58) Field of Classification Search ........... 313/498–512; 427/66, 532–535, 539; 257/40, 72, 98–100, 257/642–643, 759; 438/26, 28–29, 34, 82; 428/917
See application file for complete search history.

(56) References Cited

U.S. PATENT DOCUMENTS

| 6,548,961 B2 | 4/2003 | Barth et al. |
| 6,831,298 B2 | 12/2004 | Park et al. |
| 7,518,147 B2 | 4/2009 | Bae et al. |
| 7,755,279 B2 | 7/2010 | Park et al. |
| 2009/0072758 A1* | 3/2009 | Kimura et al. ............ 315/291 |

FOREIGN PATENT DOCUMENTS

| KR | 10-2004-0007823 A | 1/2004 |
| KR | 1020040008322 A | 1/2004 |
| KR | 10-2005-0066630 A | 6/2005 |
| KR | 1020050069313 | 7/2005 |
| KR | 10-0766949 B1 | 10/2007 |
| KR | 1020080082233 A | 9/2008 |

\* cited by examiner

*Primary Examiner* — Anh Mai
*Assistant Examiner* — Fatima Farokhrooz
(74) *Attorney, Agent, or Firm* — Robert E. Bushnell, Esq.

(57) ABSTRACT

An organic light emitting display resulting in an improved aperture ratio and a manufacturing method thereof. The organic light emitting display that includes a plurality of pixels arranged between first and second substrates, each of said pixels includes a plurality of thin film transistors, an organic light emitting diode, and a capacitor. The thin film transistors and the organic light emitting diode are formed on the first substrate and the capacitor is formed on the second substrate, and the thin film transistors and the capacitor are electrically connected with each other upon the first substrate being bonded to the second substrate.

13 Claims, 15 Drawing Sheets

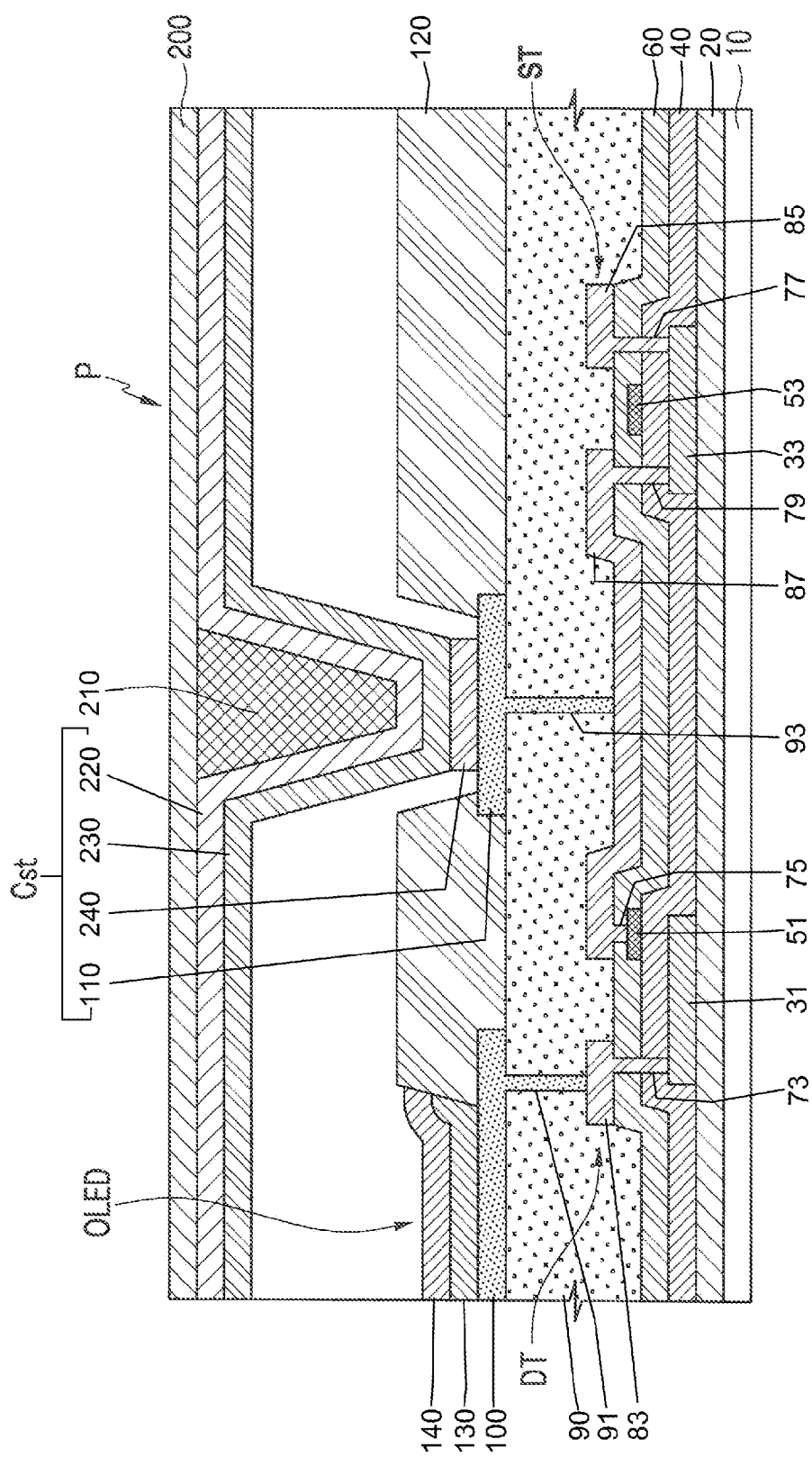

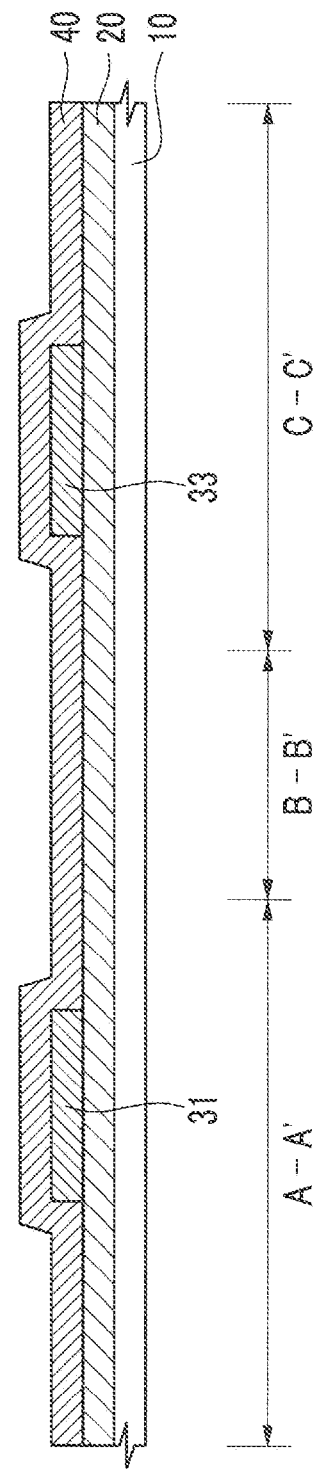

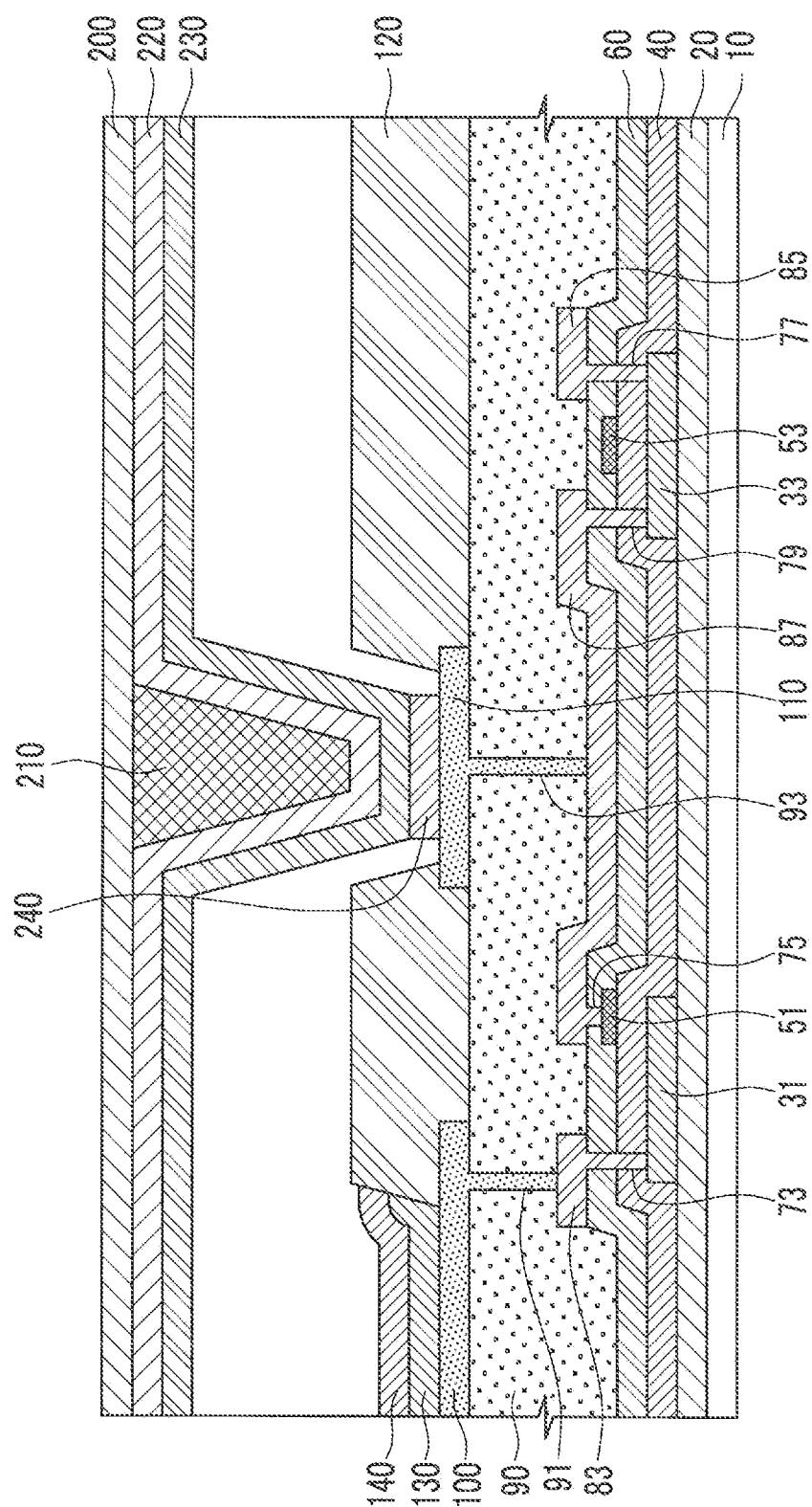

ORGANIC LIGHT EMITTING DISPLAY AND MANUFACTURING METHOD THEREOF

CLAIM OF PRIORITY

This application makes reference to, incorporates the same herein, and claims all benefits accruing under 35 U.S.C. §119 from an application earlier filed in the Korean Intellectual Property Office on Feb. 8, 2010 and there duly assigned Serial No. 10-2010-0011511.

BACKGROUND OF THE INVENTION

1. Field of the Invention

The described technology relates generally to an organic light emitting display and a manufacturing method thereof capable of improving an aperture ratio.

2. Description of the Related Art

Among flat panel displays, an organic light emitting display is a self light emitting type of display that electrically excites an organic compound that emits light.

Since the organic light emitting display does not require a backlight as with a liquid crystal display, the organic light emitting display can become thin and light, and a manufacturing process of the organic light emitting display can be simplified. Further, the organic light emitting display can be fabricated at low temperature, have a high-speed response speed of 1 ms or less, and show characteristics such as low power consumption, wide viewing angle, and high contrast.

The organic light emitting display includes an organic emission layer between an anode and a cathode. Therefore, holes supplied from the anode and electrons supplied from the cathode are coupled to each other in the organic emission layer to form an exciton that is an electron-hole pair, causing the organic light emitting display to emit light by energy generated upon the exciton being restored to a ground state.

Generally, the organic light emitting display is manufactured by forming thin film transistors and an organic light emitting diode electrically connected with the thin film transistors on a substrate and thereafter, bonding the substrate to a sealing substrate.

The organic light emitting display manufactured as above operates as any one of a top emission type or a bottom emission type. the bottom emission type has a more stable diode than the top emission type, but has a lower aperture ratio than the top emission type.

The bottom emission type includes a light emitting area in addition to a transistor area, a capacitor area, and a wire area. Among them, only when the capacitor has a predetermined capacity or more, the capacitor may maintain signal data of one frame and may be compensated. it is also difficult to decrease the size of the capacitor which occupies a large area.

Further, thinning the capacitor causes a short-circuit defective rate and a process distribution increase.

The above information disclosed in this Background section is only for enhancement of understanding of the background of the described technology, and therefore it may contain information that does not constitute prior art as per 35 U.S.C. §102.

SUMMARY OF THE INVENTION

The described technology has been made in an effort to provide an organic light emitting display capable of improving an aperture ratio.

Further, the described technology has been made in an effort to provide a manufacturing method of an organic light emitting display capable of improving an aperture ratio.

An exemplary embodiment provides an organic light emitting display that includes a first substrate facing a second substrate and a plurality of pixels arranged between the first substrate and the second substrate, each of said pixels includes a plurality of thin film transistors, an organic light emitting diode, and a capacitor, wherein the plurality of thin film transistors and the organic light emitting diode are arranged on the first substrate and the capacitor is arranged on the second substrate, the plurality of thin film transistors and the capacitor being electrically connected to each other.

The capacitor of the display may include first lower electrode, also known as a first capacitor lower electrode, arranged on the first substrate and being electrically connected to the thin film transistors, the first capacitor lower electrode also being electrically connected to the capacitor.

The first capacitor lower electrode may be electrically connected to a gate electrode of one of the thin film transistors and a drain electrode of another of the thin film transistors. The capacitor may include a spacer arranged on the second substrate, a capacitor upper electrode arranged on the spacer and a dielectric layer arranged on the capacitor upper electrode.

The first capacitor lower electrode may contact the dielectric layer. The capacitor may also include second lower electrode, also known as a second capacitor lower electrode, arranged on the dielectric layer. The second capacitor lower electrode may contact the first capacitor lower electrode.

The display may also include first and second semiconductor layers each arranged on the first substrate, a gate insulating layer arranged on the first substrate that includes the first and second semiconductor layers, first and second gate electrodes arranged on the gate insulating layer and partially overlapping the first and second semiconductor layers, respectively, an interlayer insulating layer arranged on the first substrate that includes the first and second gate electrodes, the interlayer insulating layer being perforated by a contact hole to expose the first gate electrode, first source and drain electrodes and second source and drain electrodes arranged on the interlayer insulating layer, the second drain electrode being electrically connected to the exposed first gate electrode and a passivation layer arranged on the first substrate that includes the first source and drain electrodes and the second source and drain electrodes, the passivation layer may be perforated by first and second via holes exposing the first drain electrode and the second drain electrode respectively, the first capacitor lower electrode may be arranged on the passivation layer. The second drain electrode may extend to be electrically connected to the first gate electrode.

The display may also include a pixel electrode arranged on the passivation layer, a pixel defining layer arranged on the passivation layer and including first and second openings exposing the pixel electrode and the first capacitor lower electrode respectively, an organic layer arranged on the exposed pixel electrode and a counter electrode arranged on the organic layer. The first capacitor lower electrode may be electrically connected to the first gate electrode and the second drain electrode through the second via hole. The first capacitor lower electrode and the pixel electrode may be arranged on the same layer. The first capacitor lower electrode and the pixel electrode may be comprised of the same material.

According to another aspect of the present invention, there is provided a method of making an organic light emitting display, including forming a plurality of thin film transistors and an organic light emitting diode on a first substrate, forming a capacitor on a second substrate and electrically connecting the plurality of thin film transistors and the capacitor to each other by bonding the first substrate to the second substrate. The forming of the organic light emitting diode on the substrate may include forming a first capacitor lower electrode on the first substrate that is electrically connected to the thin film transistors. The first capacitor lower electrode may be electrically connected to the capacitor. The forming of the capacitor on the second substrate may include forming a spacer on the second substrate, forming a capacitor upper electrode on the spacer and forming a dielectric layer on the capacitor upper electrode. The first capacitor lower electrode may contact the dielectric layer upon the bonding of the first substrate to the second substrate. The method may also include forming a second capacitor lower electrode on the dielectric layer. The first capacitor lower electrode may contact the second capacitor lower electrode upon the bonding of the first substrate to the second substrate.

Before the forming of the first capacitor lower electrode, the method may also include forming first and second semiconductor layers on the first substrate, forming a gate insulating layer on the first substrate that includes the first and second semiconductor layers, forming first and second gate electrodes on the gate insulating layer to partially overlap the first and second semiconductor layers, forming an interlayer insulating layer on the first substrate that includes the first and second gate electrodes, forming first to fifth contact holes by partially etching the gate insulating layer and the interlayer insulating layer, forming first source and drain electrodes and second source and drain electrodes on the interlayer insulating layer, the second drain electrode being electrically connected to the first gate electrode that is exposed by one of the contact holes, forming a passivation layer on the first substrate that includes the first source and drain electrodes and the second source and drain electrodes and etching the passivation layer to form first and second via holes, the first capacitor lower electrode being arranged on the passivation layer. The second drain electrode may extend to be electrically connected to the first gate electrode. The method may also include forming a pixel electrode on the passivation layer, forming a pixel defining layer on the passivation layer, the pixel defining layer being perforated by first and second openings that expose the pixel electrode and the first capacitor lower electrode respectively, forming an organic layer on the exposed pixel electrode and forming a counter electrode on the organic layer. The pixel electrode and the first capacitor lower electrode may be produced in the same process.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 3 is a cross-sectional view illustrating a lamination structure of the unit pixel area of FIG. 1;

FIGS. 4A to 8B are plan views and cross-sectional views for describing a method for forming thin film transistors and an organic light emitting diode on a first substrate;

FIG. 11 is a cross-sectional view for describing the connection relationship between thin film transistors and a capacitor.

DETAILED DESCRIPTION OF THE INVENTION

Hereinafter, an organic light emitting display and a manufacturing method thereof according to exemplary embodiments will be described with reference to the accompanying drawings. The structure of the organic light emitting display described below is just an exemplary embodiment for describing the present invention and the present invention is in no way limited to the exemplary embodiment. In addition, the structure of the organic light emitting display may be variously modified and still be within the scope of the present invention.

Figure 1:
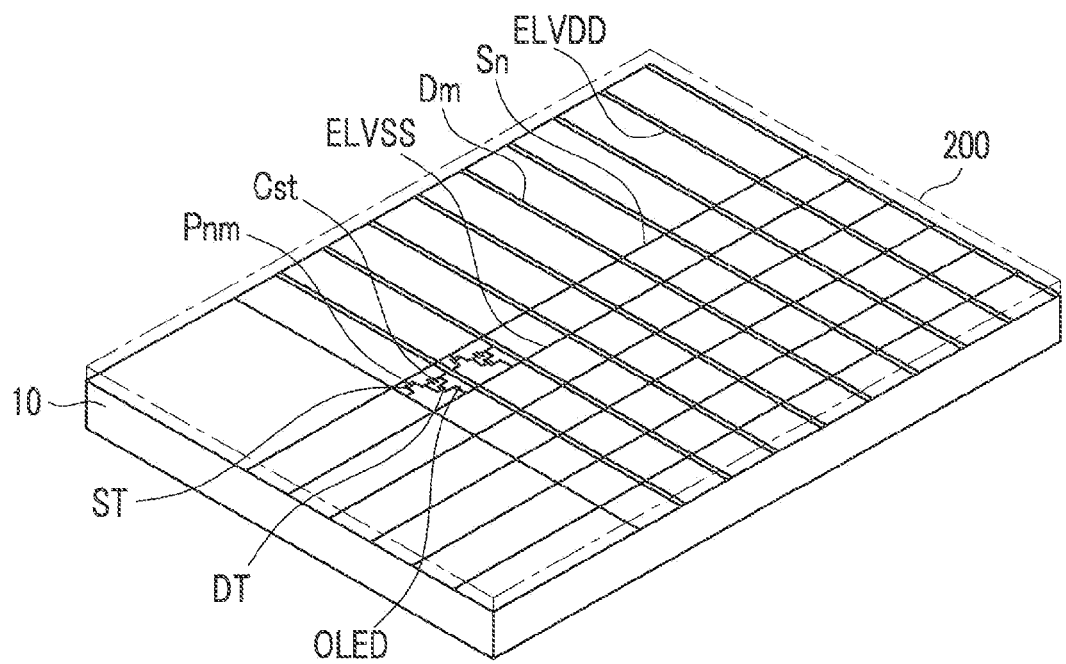
FIG. 1 is a perspective view schematically illustrating one example of an organic light emitting display according to an exemplary embodiment.
Figure 2:
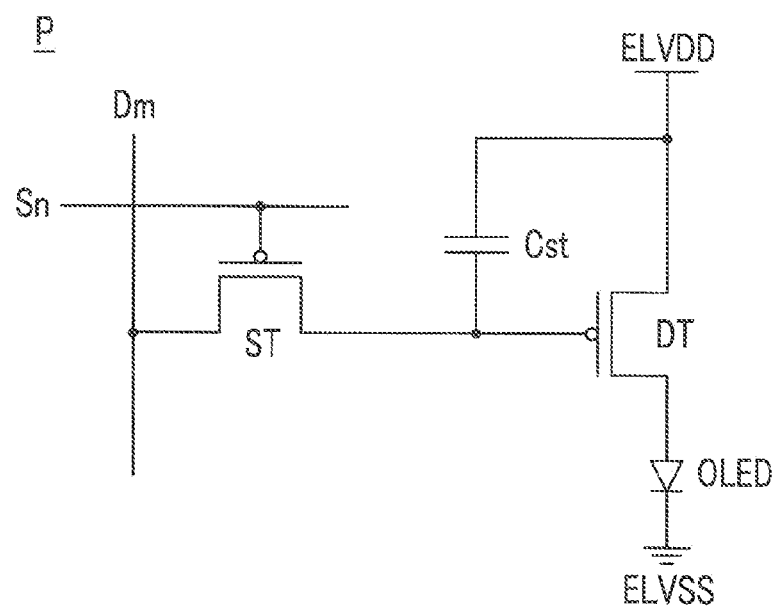
FIG. 2 is a circuit diagram illustrating an enlarged unit pixel area of FIG. 1.

FIG. 1 is a perspective view schematically illustrating one example of an organic light emitting display according to an exemplary embodiment, FIG. 2 is a circuit diagram illustrating an enlarged unit pixel area P of FIG. 1, and FIG. 3 is a cross-sectional view illustrating a lamination structure of the unit pixel area P of FIG. 1.

Referring to FIGS. 1 to 3, the organic light emitting display according to the exemplary embodiment includes a plurality of signal lines D1 to Dm, S1 to Sn, ELVDD, and ELVSS arranged in a matrix and pixels P11 to Pnm formed at intersection areas where data lines D1 to Dm, S1 to Sn, ELVDD, and ELVSS intersect each other and between first and second substrates 10 and 200 that face each other.

The signal lines are constituted by data lines D1 to Dm to which data signals are applied, power supply lines ELVDD and ELVSS to which power is always applied while the organic light emitting display is being driven, and gate lines S1 to Sn to which scan signals for selecting the pixels P11 to Pnm are applied.

A unit pixel P includes two thin film transistors TFTs, a capacitor Cst, and an organic light emitting diode OLED. one of the two thin film transistors is a switching TFT (ST) and the other one is defined as a driving TFT (DT) due to their roles.

The switching TFT (ST) is turned on or turned off in response to a scan signal from the gate line Sn. when the switching TFT (ST) is turned on, the switching TFT (ST) transfers a data signal from the data line Dm. The capacitor Cst includes an upper electrode connected to the first power supply line ELVDD and a lower electrode connected with a drain electrode of the switching TFT (ST) and a gate electrode of the driving TFT. The capacitor Cst stores a data signal received through the switching TFT (ST) and serves to sustain a gate-source voltage Vgs of the driving TFT (DT) for a predetermined time.

The drain electrode of the switching TFT (ST) is connected to the gate electrode of the driving TFT (DT), the first power supply line ELVDD is connected to a source electrode of the driving TFT (DT) and an anode electrode of the organic light emitting diode OLED is connected to a drain electrode of the driving TFT (DT).

Therefore, the driving TFT (DT) generates driving current corresponding to the data signal transferred through the switching TFT (ST) and outputs the driving current to the organic light emitting diode OLED.

The organic light emitting diode OLED includes an anode, a cathode, and a light emission layer positioned between the anode and the cathode. The anode is connected to the drain electrode of the driving TFT (DT) and the cathode is connected to a second power supply line ELVSS to perform a light emitting operation depending upon the driving current.

In this case, the thin film transistors DT and ST and the organic light emitting diode OLED are formed on the first substrate 10 and the capacitor Cst is formed on the second substrate 200.

According to the exemplary embodiment, a method of manufacturing an organic light emitting display includes a diode substrate forming step of forming first and second thin film transistors and an organic light emitting diode on a first substrate 10, a capacitor substrate forming step of forming a capacitor on a second substrate 200, and first and second substrates bonding step of electrically connecting the capacitor to the first and second thin film transistors by bonding the second substrate 10 to the first substrate 200.

First, referring to FIGS. 4A to 8B, a method of forming the first and second thin film transistors and the organic light emitting diode on the first substrate will be described. In this case, 'FIG. A' is a plan view after each process is performed and 'FIG. B' is a cross-sectional view taken along lines A-A', B-B', and C-C' of 'FIG. A'. However, in 'FIG. A', a film formed on the overall surface of the first substrate and a film patterned after the film is formed may not be shown for convenience, but it will be able to be fully appreciated with reference to 'FIG. B'. Further, a 'transistor area', a 'capacitor area', and 'a light emitting area' used in the following description do not have determined positions and define predetermined positions where the transistor, the capacitor, and the organic light emitting diode are formed.

Figure 4A:
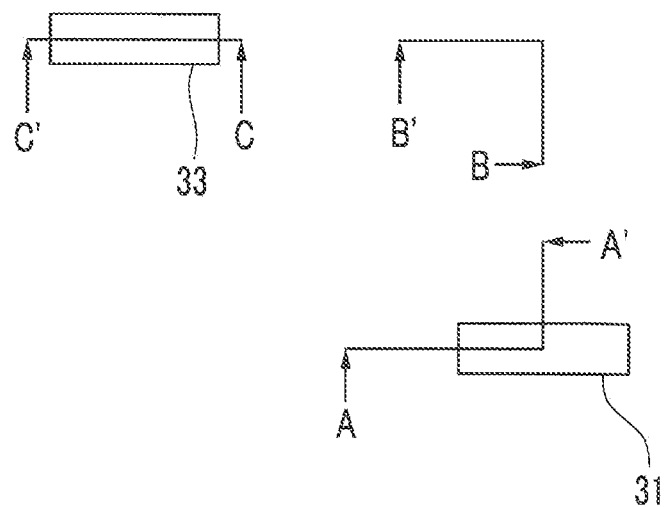

Referring to FIGS. 4A and 4B, a buffer layer 20 is formed on the overall surface of the first substrate 10 and an amorphous silicon layer (not shown) is formed on the buffer layer 20. In this case, the first substrate 10 may be a transparent insulating substrate made of glass, quartz, sapphire, and the like and the buffer layer 20 may be formed by depositing silicon oxide or silicon nitride via a PECVD technique.

The buffer layer 20 prevents the amorphous silicon layer (not shown) from being contaminated by impurities diffused from the first substrate 10 while crystallizing the amorphous silicon layer (not shown) which is a post process.

Thereafter, the amorphous silicon layer (not shown) is crystallized by using a technique such as excimer laser annealing (ELA), sequential lateral solidification (SLS), metal induced crystallization (MIC), or metal induced lateral crystallization (MILC), which is a general crystallization technique, the amorphous silicon layer is patterned by using an etching process, and each of first and second semiconductor layers 31 and 33 are formed in the transistor area within the unit pixel. In some cases, the crystallization process is omitted, such that the first and the second semiconductor layers 31 and 33 may be made out of the amorphous silicon layer. Alternatively, One semiconductor layer may be crystallized and the other semiconductor layer may not be crystallized.

After formation of first and second semiconductor layers 31 and 33, a gate insulating layer 40 is formed on the overall surface of the first substrate 10 that includes the first and the second semiconductor layers 31 and 33. The gate insulating layer 40 may be made out of silicon oxide, silicon nitride, or a lamination structure thereof.

Figure 5A:
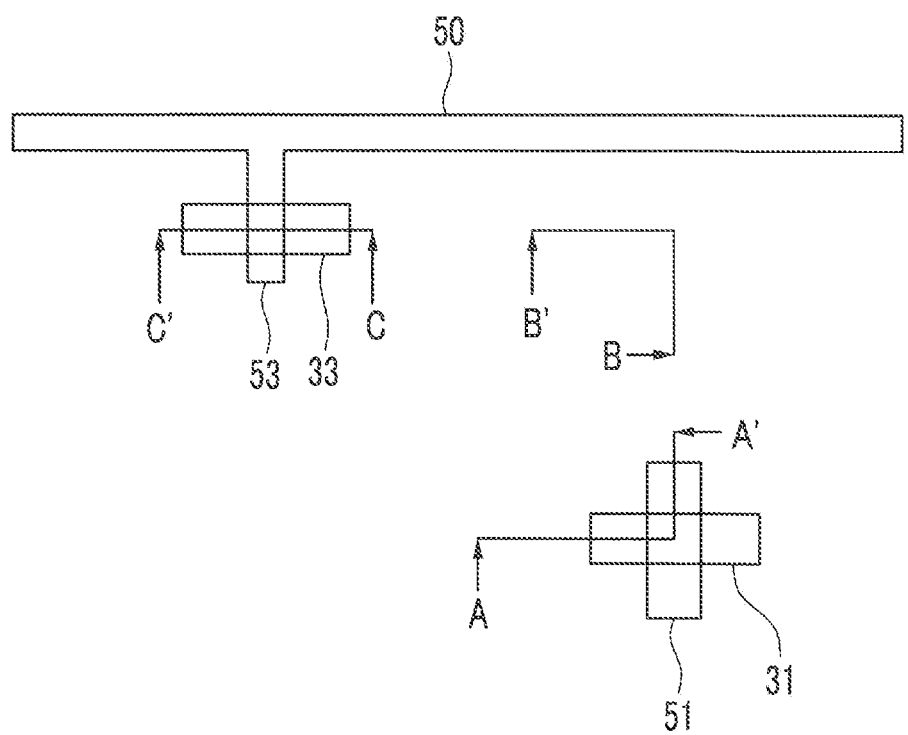
Figure 5B:
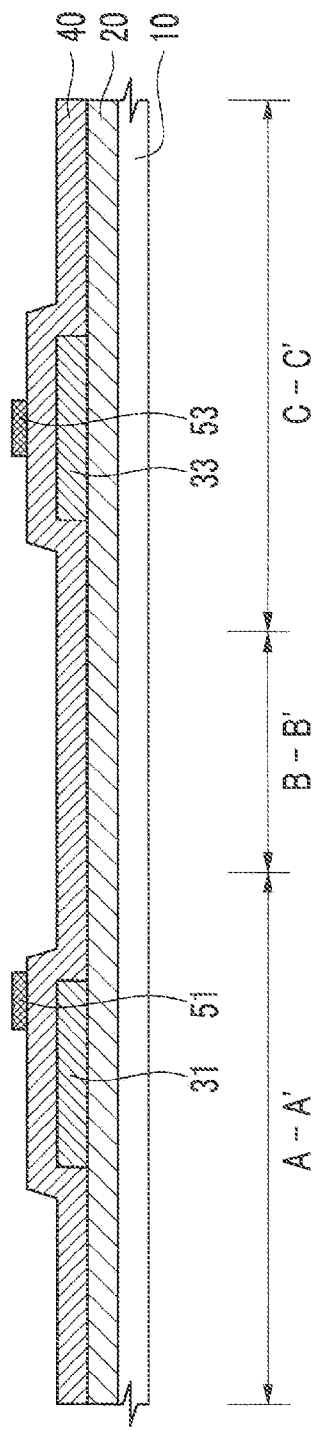

Next, referring to FIGS. 5A and 5B, a gate electrode material (not shown) is applied onto the gate insulating layer 40, and thereafter, the gate electrode material is patterned by an etching process to form first and second gate electrodes 51 and 53 in the transistor area. In addition, a scan line 50 into which a scan signal is input, is also formed upon the formation of the first and second gate electrodes 51 and 53, the second gate electrode 53 being connected to the scan line 50.

The first and second gate electrodes 51 and 53 partially overlapped the first and second semiconductor layers 31 and 33. Portions of the first and second semiconductor layers 31 and 33 that are overlapped by the first and second gate electrodes 51 and 53 represent the channel region of the first and second semiconductor layers.

The first and second gate electrodes 51 and 53 may be a single layer of aluminum (Al), an aluminum alloy such as aluminum-neodymium (Al—Nd) or a plurality of layers in which an aluminum alloy layer is laminated on a chrome (Cr) or molybdenum (Mo) alloy layer.

Figure 6A:
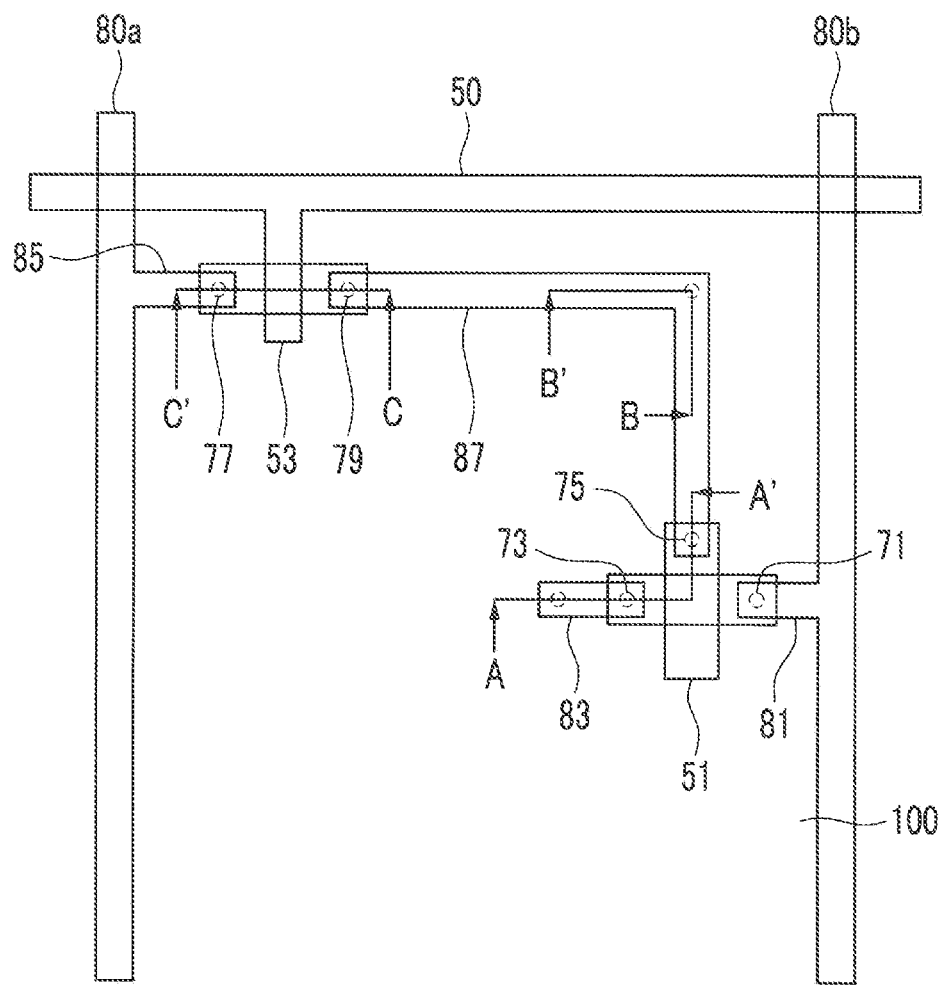
Figure 6B:
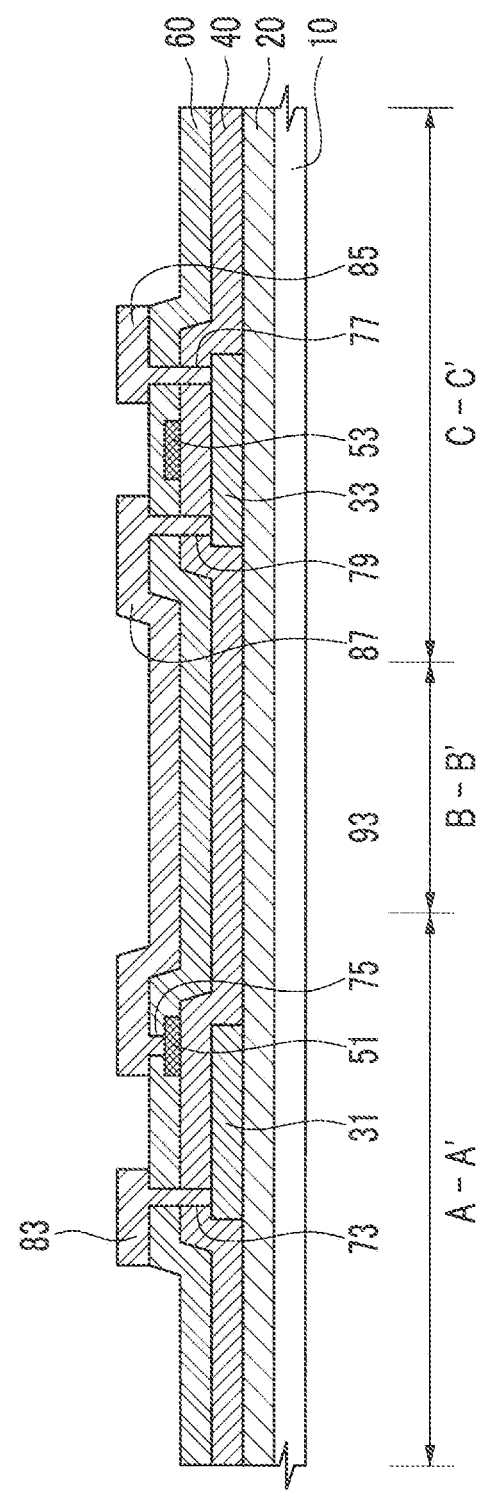

Next, referring to FIGS. 6A and 6B, an interlayer insulating layer 60 is formed at the upper part of the first substrate 10 that includes the first and second gate electrodes 51 and 53. the interlayer insulating layer 60 may be a silicon nitride layer or a silicon oxide layer.

Thereafter, the gate insulating layer 40 and the interlayer insulating layer 60 are partially etched to form first to fifth contact holes 71, 73, 75, 77, and 79.

A first source area and a first drain area of the first semiconductor layer 31 are exposed by the first and second contact holes 71 and 73, the first gate electrode 51 is exposed by the third contact hole 75 and a second source area and a second drain area of the second semiconductor layer 33 are exposed by the fourth and fifth contact holes 77 and 79.

Thereafter, after a metallic film (not shown) is formed on the interlayer insulating layer 60. the metallic film is patterned through an etching process to form first source and drain electrodes 81 and 83 and second source and drain electrodes 85 and 87.

The first source and drain electrodes 81 and 83 are connected to the source and drain areas respectively of the first semiconductor layer 31 through the first and second contact holes 71 and 73. the second source and drain electrodes 85 and 87 are connected to the source and drain areas respectively of the second semiconductor layer 33 through the fourth and fifth contact holes 77 and 79. In this case, the second drain electrode 87 extends so that it is electrically connected to the first gate electrode 51 exposed through the third contact hole 75.

a data line 80a to which a data signal is applied, and a power supply voltage line 80b to which power supply voltage is applied, are produced from the same metal film used to produce the first and second source and drain electrodes 81, 83, 85 and 87. the second source electrode 85 is formed by extending the data line 80a and the first source electrode 81 is formed by extending the power supply voltage line 80b. Therefore, the power supply voltage is applied to the first source electrode 81 and the data signal is applied to the second source electrode 85.

The metallic film (not shown) may form a single layer that includes a material selected from Mo, W, MoW, AlNd, Ti, Cu, a Cu alloy, Ag, and an Ag alloy. The metallic film may also be a lamination structure selected from a group formed in a dual-layer structure including a layer of one of Mo, Cu, Al, or Ag which are low-resistance materials or a multi-layer structure of two layers or more in order to reduce wiring resistance.

Figure 7A:
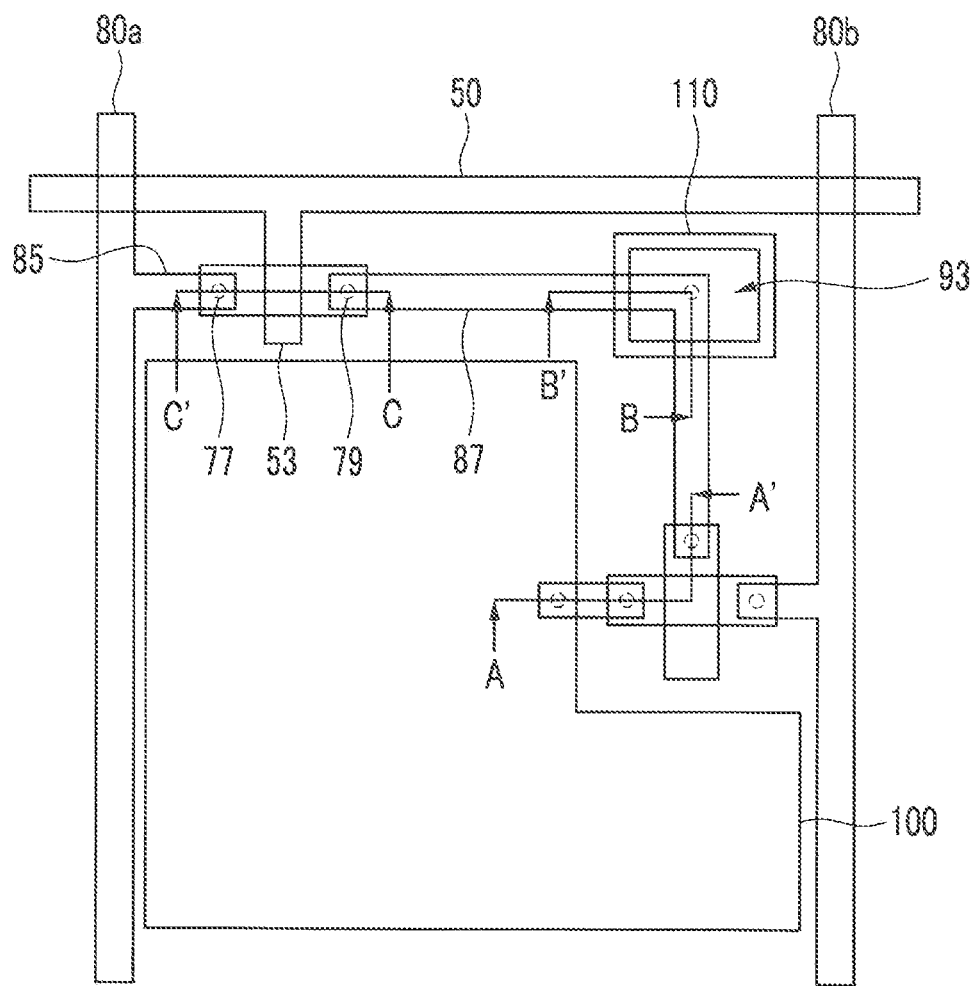
Figure 7B:
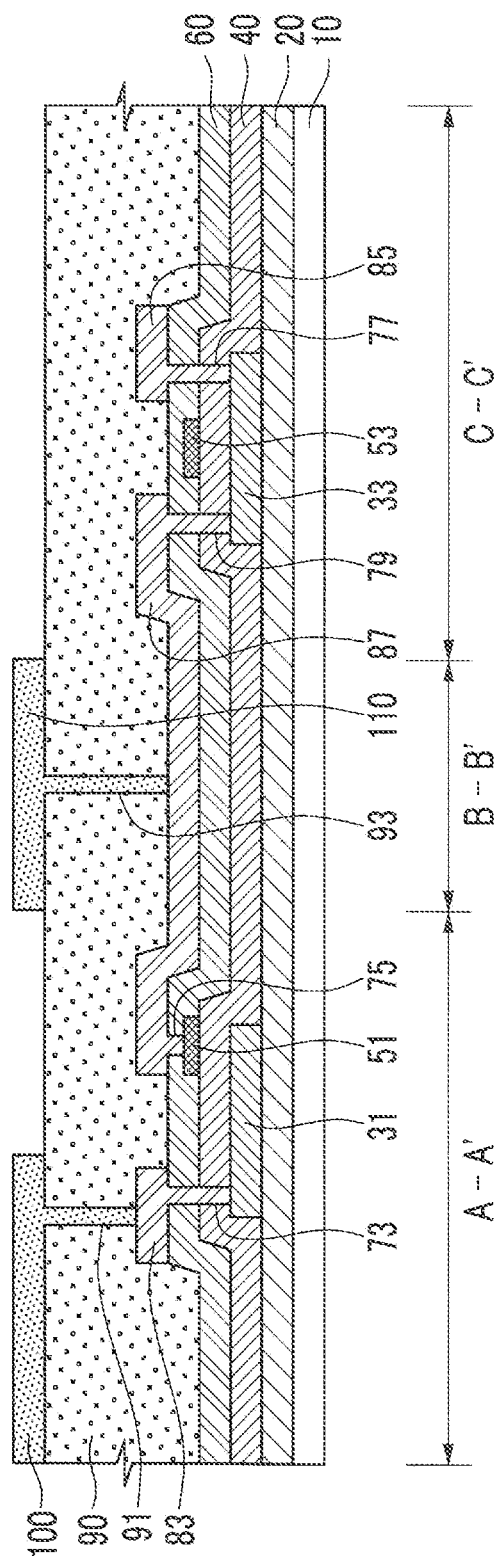

Next, referring to FIGS. 7A and 7B, a passivation layer 90 having a predetermined thickness is formed on the overall surface of the first substrate 10. the passivation layer 90 may be a single layer such as an organic layer or an inorganic layer or a lamination structure of an inorganic layer and an organic layer.

Thereafter, the passivation layer 90 is partially etched through an etching process to form first and second via holes 91 and 93. Upon said etching, the first drain electrode 83 is partially exposed by the first via hole 91 and the second drain electrode 87 is partially exposed by the second via hole 93.

Thereafter, a metallic film (not shown) is formed on the passivation layer 90 that includes the plurality of via holes 91 and 93 and is patterned through an etching process to produce a pixel electrode 100 in the light emitting area and a first capacitor lower electrode (i.e. first lower electrode of the capacitor) 110 in the capacitor area.

The pixel electrode 100 is connected to the first drain electrode 83 through the first via hole 91 and the first capacitor lower electrode 110 is electrically connected to the second drain electrode 87 and the first gate electrode 51 through the second via hole 93.

In this case, in the case of the bottom emission type, the pixel electrode 100 may be a transparent electrode made out of a material selected from a group consisting of indium tin oxide (ITO), indium zinc oxide (IZO), tin oxide (TO), and zinc oxide (ZnO).

Meanwhile, in the case of the top emission type, the pixel electrode 100 may be a reflective electrode that includes a reflective layer made out of a material selected from a group consisting of Ag, Mg, Al, Pt, Pd, Au, Ni, Nd, Ir, Cr, and alloys thereof and a transparent layer made out of a material selected from a group consisting of indium tin oxide (ITO), indium zinc oxide (IZO), tin oxide (TO), and zinc oxide (ZnO) laminated thereon. In addition, the transparent layer may instead be formed on the bottom of the reflective layer. However, in the present invention, the configuration of the pixel electrode is not limited.

The first capacitor lower electrode 110 is connected to a capacitor formed on the second substrate 200 to be described below to electrically connect the first and second thin film transistors to the capacitor. The first capacitor lower electrode 110 is not limited to a particular location, but is preferably positioned at a location that does not reduce the range of the light emitting area.

Meanwhile, it is advantageous that the first capacitor lower electrode 110 be produced in the same process and include the same material as the pixel electrode 100, but in the present invention, the material and process of the first capacitor lower electrode is in now way so limited.

Figure 8A:
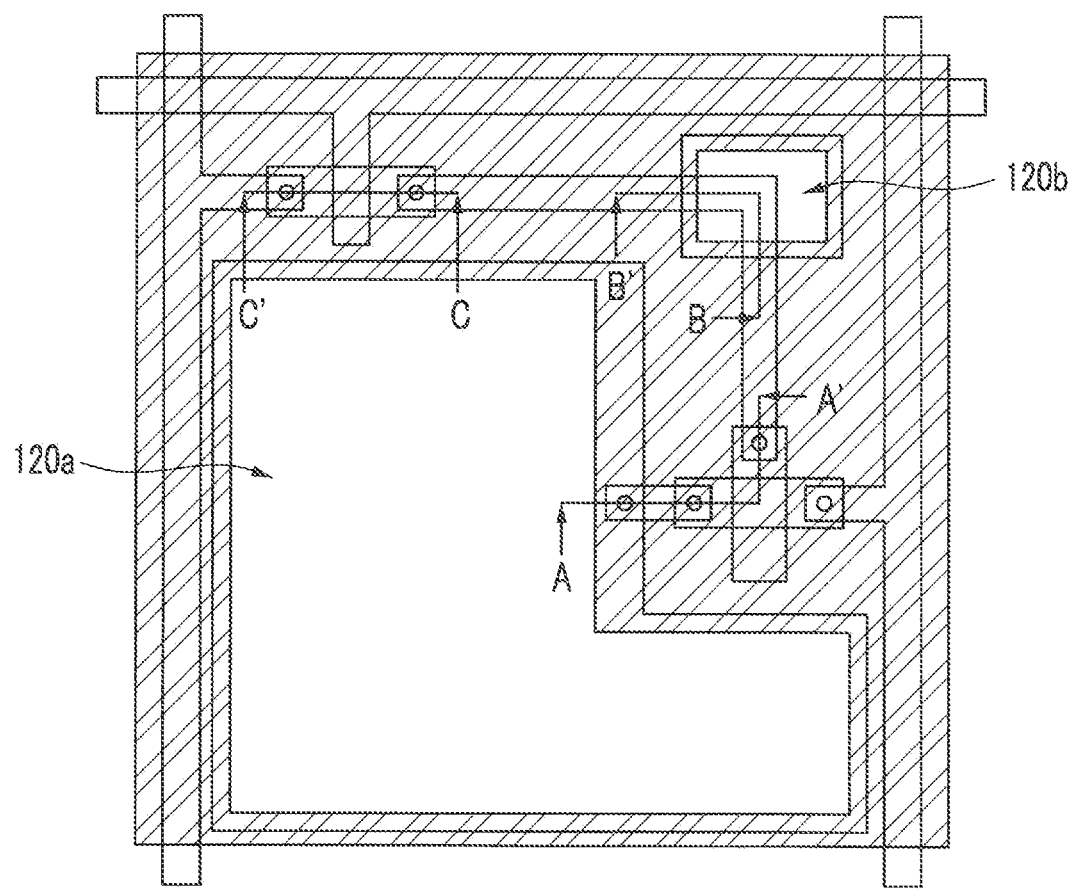
Figure 8B:
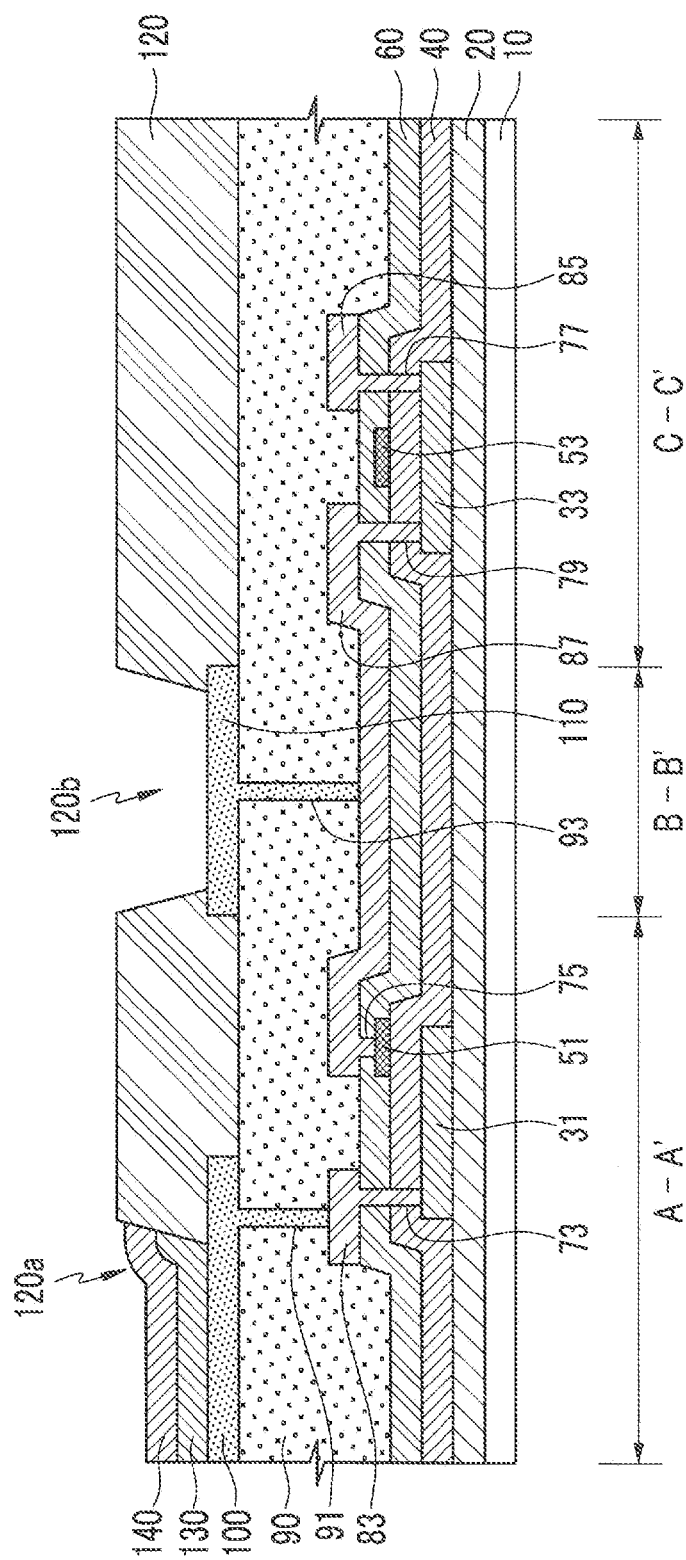

Next, referring to FIGS. 8A and 8B, a pixel defining layer 120, including first and second openings 120a and 120b, is formed on the passivation layer 90 to partially expose the pixel electrode 100 and the first capacitor lower electrode 110.

The pixel defining layer 120 may be made out of a material selected from a group consisting of polyimide, benzocyclobutene series resin, spin on glass (SOG), and acrylate.

Thereafter, an organic layer 130 is formed in the first opening 120a and a counter electrode 140 is formed on the organic layer 130.

The organic layer 130 may be produced by using a low molecule deposition technique or a thermal transferring technique and may include at least one layer selected from an organic emission layer, an electron injection layer, an electron transport layer, a hole injection layer, a hole transport layer and a hole suppress layer.

In the case of the bottom emission type, the counter electrode 140 is reflective and may be made out of a material selected from a group consisting of Li, Ca, LiF/Ca, LiF/Al, Al, Mg, and alloys thereof.

Meanwhile, in the case of the top emission type, the counter electrode 140 may be configured to include a material having a small work function, such as a material selected from a group consisting of Li, Ca, LiF/Ca, LiF/Al, Al, Mg, and a Mg alloy and having a small thickness in the range of 5 to 30 nm. The counter electrode 140 may additionally include a transparent layer of indium tin oxide (ITO), indium zinc oxide (IZO), and the like having a low-resistance characteristic laminated onto the thin, small work function layer.

In the above description, the method of forming the thin film transistors and the organic light emitting diode on the first substrate 10 has been described. Hereinafter, a method of forming the capacitor on the second substrate 200 will now be described.

Figure 9A:
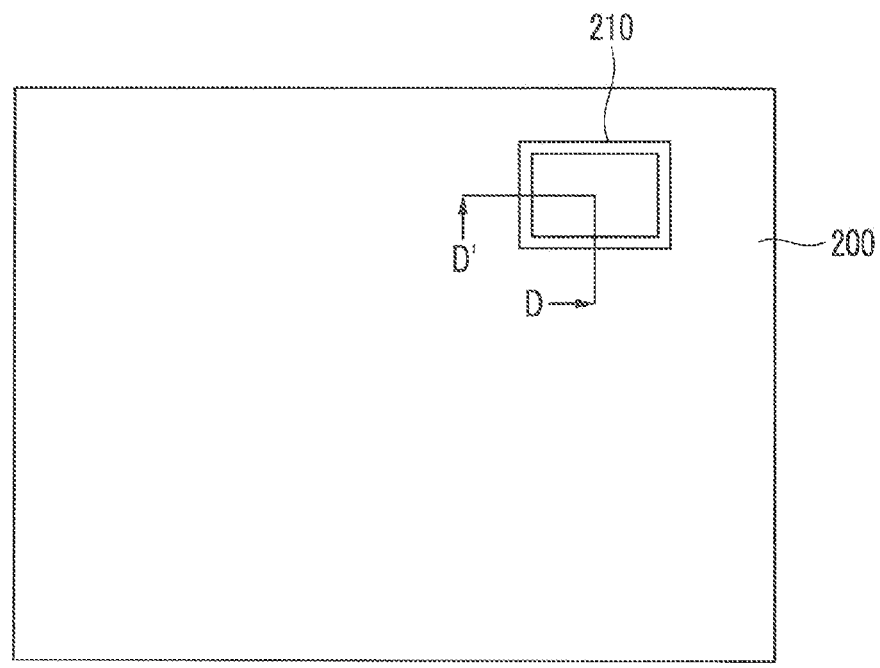
FIGS. 9A to 10B are plan views and cross-sectional views for describing a method for forming a capacitor on a second substrate.
Figure 9B:
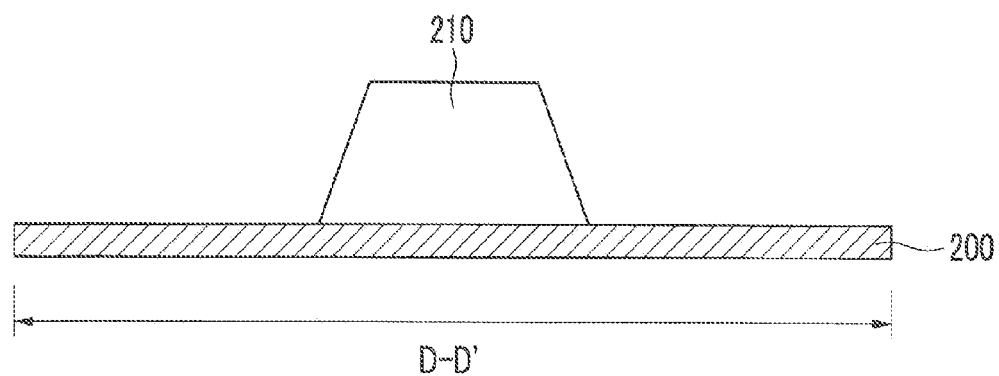

First, referring to FIGS. 9A and 9B, a spacer 210 is formed in a capacitor area of the second substrate 200 to correspond to the capacitor area of the first substrate 10 in which the first capacitor lower electrode 110 is formed. In this case, when the spacer 210 is too high, the space between the first substrate 10 and the second substrate 200 becomes larger, such that the entire thickness of the organic light emitting display is increased. Therefore, the height of the spacer 210 is properly selected within a process range. However, the position of the capacitor area on the second substrate 200 is not limited and the capacitor area represents a predetermined area where the capacitor is formed.

Meanwhile, the upper end of the spacer 210 may be flattened such that it becomes easier to form the capacitor in a following process. The spacer 210 serves to facilitate electrical connection between the capacitor and the thin film transistors. When the spacer 210 does not need the function, the spacer 210 may not be formed.

Figure 10A:
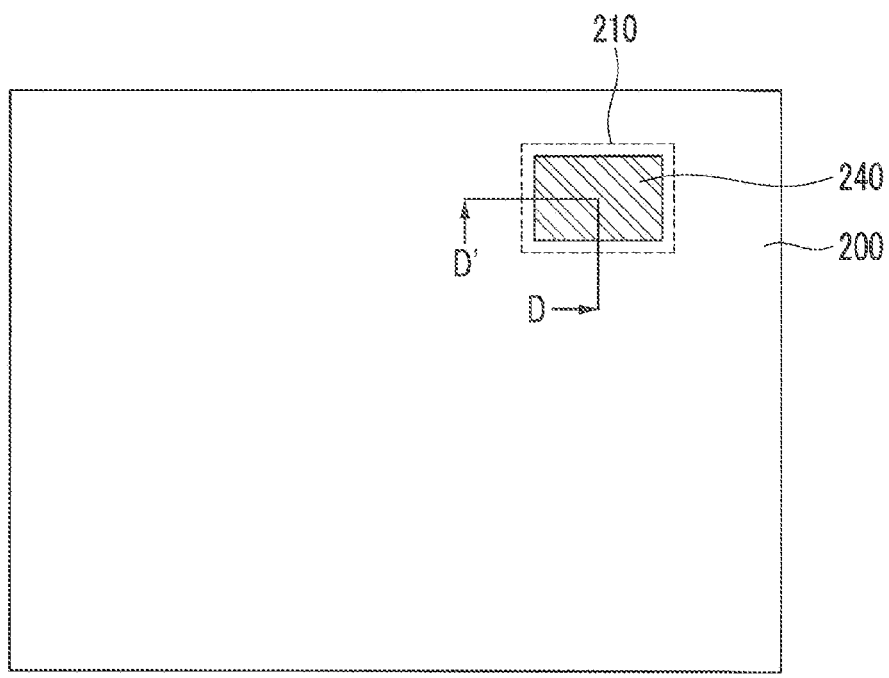
Figure 10B:
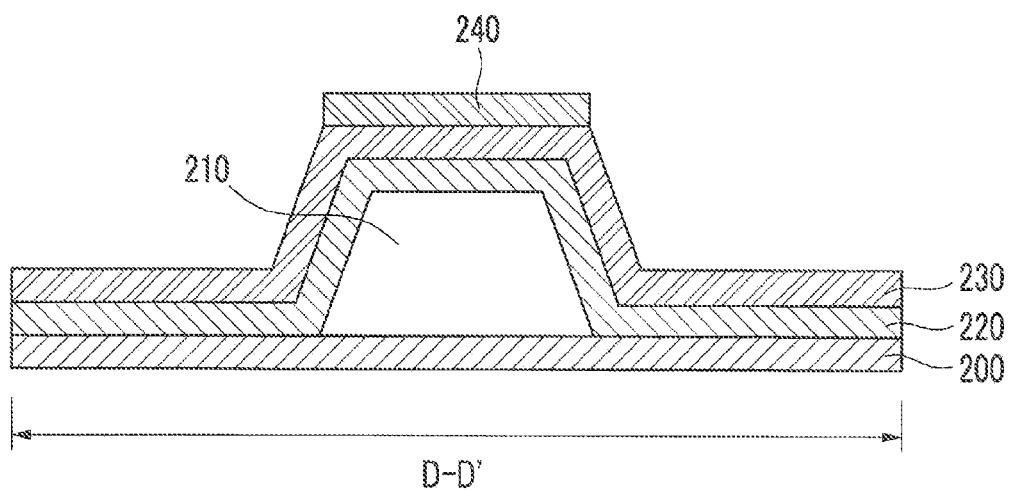

Next, referring to FIGS. 10A and 10B, a capacitor upper electrode 220 is formed on the second substrate 200 where the spacer 210 is formed and a power supply voltage is applied to the capacitor upper electrode 220. In this case, the capacitor upper electrode 220 may be produced by forming a metallic layer on the overall surface of the second substrate 200 or by patterning a part of the metallic layer formed on the overall surface. In the case of the bottom emission type, the capacitor upper electrode 220 may be formed on the overall surface of the second substrate 200 or may be patterned, but in the case of the top emission type, the capacitor upper electrode 220 is preferably patterned in order not to reduce the range of the light emitting area.

Thereafter, a dielectric layer 230 of the capacitor is formed on the capacitor upper electrode 220. the dielectric layer 230 may be an insulating layer such as a silicon oxide layer, a silicon nitride layer or a high-dielectric inorganic insulating layer. The dielectric layer 230 may be formed on the overall surface of the capacitor upper electrode 220 or may be formed within the capacitor area on the capacitor upper electrode 220.

Thereafter, a second capacitor lower electrode (i.e. second lower electrode of the capacitor) 240 is formed in the capacitor area and on the dielectric layer 230. The second capacitor lower electrode 240 may be produced by depositing a metallic layer on the overall surface of the second substrate 200 where the dielectric layer 230 is formed and patterning the deposited metallic layer. FIGS. 9A to 10B illustrate one method of forming the capacitor on the second substrate 200, but the present invention is in no way so limited.

Turning now to FIG. 11,

FIG. 11 is a cross-sectional view of a pixel for describing the connection relationship between the thin film transistors and the capacitor. Referring to FIG. 11, when the organic light emitting display is completed by bonding the first substrate 10 to the second substrate 200, the first capacitor lower electrode 110 of the first substrate 10 contacts the capacitor formed on the second substrate 200 to electrically connect the thin film transistors to the capacitor. Upon the first substrate 10 being bonded to the second substrate 200, the first capacitor lower electrode 110 contacts the second capacitor lower electrode 240 of the second substrate 200.

However, in the exemplary embodiment, it has been described as an example that the first capacitor lower electrode 110 of the first substrate 10 and the second capacitor lower electrode 240 of the second substrate 200 form the lower electrode of the capacitor. In a variation, the lower electrode of the capacitor may be formed by only the first capacitor lower electrode 110 without the second capacitor lower electrode 240. In this variation, the first capacitor lower electrode 110 contacts the dielectric layer 230.

According to the exemplary embodiments, the capacitor is not formed on the substrate that the thin film transistors and the organic light emitting diode are formed. as a result, even the area where the capacitor is formed may be formed as part of the light emitting area, thereby improving an aperture ratio.

While this disclosure has been described in connection with what is presently considered to be practical exemplary embodiments, it is to be understood to those skilled in the art that the invention is not limited to the disclosed embodiments. Therefore, the invention is intended to cover various modifications and equivalent arrangements included within the spirit and scope of the appended claims.

What is claimed is:

1. An organic light emitting display, comprising:
a first substrate facing a second substrate; and
a plurality of pixels arranged between the first substrate and the second substrate, each of said pixels including a plurality of thin film transistors, an organic light emitting diode, and a capacitor, the plurality of thin film transistors and the organic light emitting diode being arranged on the first substrate and the capacitor being arranged on the second substrate, the plurality of thin film transistors and the capacitor being electrically connected to each other, wherein a first lower electrode of the capacitor being arranged on a same level and being comprised of a same material as a pixel electrode of the organic light emitting diode.

2. The organic light emitting display of claim 1, wherein the capacitor further comprises:
a spacer arranged on the second substrate;
an upper electrode arranged on the spacer; and
a dielectric layer arranged on the upper electrode.

3. The organic light emitting display of claim 1, further comprising:
first and second semiconductor layers each arranged on the first substrate;
a gate insulating layer arranged on the first substrate that includes the first and second semiconductor layers;
first and second gate electrodes arranged on the gate insulating layer and partially overlapping the first and second semiconductor layers, respectively;
an interlayer insulating layer arranged on the first substrate that includes the first and second gate electrodes, the interlayer insulating layer being perforated by a contact hole to expose the first gate electrode;
first source and drain electrodes and second source and drain electrodes arranged on the interlayer insulating layer, the second drain electrode being electrically connected to the exposed first gate electrode; and
a passivation layer arranged on the first substrate that includes the first source and drain electrodes and the second source and drain electrodes, the passivation layer being perforated by first and second via holes exposing the first drain electrode and the second drain electrode, respectively, the first lower electrode of the capacitor being arranged on the passivation layer.

4. The organic light emitting display of claim 2, wherein the first lower electrode of the capacitor contacts the dielectric layer.

5. The organic light emitting display of claim 2, wherein the capacitor further comprises a second lower electrode arranged on the dielectric layer.

6. The organic light emitting display of claim 5, wherein the second lower electrode of the capacitor contacts the first lower electrode of the capacitor.

7. The organic light emitting display of claim 3, wherein the second drain electrode extends to be electrically connected to the first gate electrode.

8. The organic light emitting display of claim 3, further comprising:
a pixel defining layer arranged on the passivation layer and including first and second openings exposing the pixel electrode and the first lower electrode of the capacitor, respectively;
an organic layer arranged on the exposed pixel electrode; and
a counter electrode arranged on the organic layer.

9. The organic light emitting display of claim 8, wherein the first lower electrode of the capacitor is electrically connected to the first gate electrode and the second drain electrode through the second via hole.

10. An organic light emitting display, comprising:
a first substrate facing a second substrate; and
a plurality of pixels arranged between the first substrate and the second substrate, each of said pixels including a plurality of thin film transistors, an organic light emitting diode, and a capacitor, the plurality of thin film transistors and the organic light emitting diode being arranged on the first substrate and the capacitor being arranged on the second substrate, the plurality of thin film transistors and the capacitor being electrically connected to each other, wherein the capacitor includes an upper electrode, a dielectric layer arranged on the upper electrode, a first lower electrode arranged on the dielectric layer, and a second lower electrode arranged on the first substrate and being in contact with the first lower electrode, the capacitor further comprises a spacer arranged on the second substrate, the upper electrode of the capacitor being arranged on the spacer.

11. An organic light emitting display, comprising:
a first substrate facing a second substrate; and
a plurality of pixels arranged between the first substrate and the second substrate, each of said pixels including a plurality of thin film transistors, an organic light emitting diode, and a capacitor, the plurality of thin film transistors and the organic light emitting diode being arranged on the first substrate and the capacitor being arranged on the second substrate, the plurality of thin film transistors and the capacitor being electrically connected to each other, wherein the capacitor includes a spacer arranged on the second substrate, an upper electrode arranged on the spacer and a dielectric layer arranged on the upper electrode.

12. The organic light emitting display of claim 11, the capacitor further comprises a first lower electrode arranged on the first substrate, the first lower electrode being in contact with the dielectric layer.

13. The organic light emitting display of claim 11, wherein the capacitor further comprises a first lower electrode arranged on the first substrate and a second lower electrode arranged on the dielectric layer, the second lower electrode being in contact with the first lower electrode.

* * * * *